United States Patent [19]
Kim et al.

[11] Patent Number: 6,037,653
[45] Date of Patent: Mar. 14, 2000

[54] SEMICONDUCTOR LEAD FRAME HAVING MULTI-LAYERED PLATING LAYER INCLUDING COPPER-NICKEL PLATING LAYER

[75] Inventors: Joong-do Kim; Kyoung-soon Bok, both of Yongin, Rep. of Korea

[73] Assignee: Samsung Aerospace Industries, Ltd., Kyonsangnam-Do, Rep. of Korea

[21] Appl. No.: 09/046,656

[22] Filed: Mar. 24, 1998

[30] Foreign Application Priority Data

Mar. 25, 1997 [KR] Rep. of Korea ............ 97-10375
Apr. 11, 1997 [KR] Rep. of Korea ............ 97-13416

[51] Int. Cl.⁷ .................................. H01L 23/495
[52] U.S. Cl. ................. 257/666; 257/667; 257/677
[58] Field of Search ......................... 257/666, 667, 257/677; 438/123

[56] References Cited

U.S. PATENT DOCUMENTS 5,001,546  3/1991  Butt ............................ 257/666
5,750,016  5/1998  Moon .......................... 428/670

FOREIGN PATENT DOCUMENTS 5-055429  3/1993  Japan ......................... 257/666

*Primary Examiner*—Sara Crane
*Attorney, Agent, or Firm*—Finnegan, Henderson, Farabow, Garrett & Dunner, L.L.P.

[57] ABSTRACT

A semiconductor lead frame and a fabricating method thereof are provided. The semiconductor lead frame includes a metal substrate, and a multi-layered plating layer including a copper-nickel alloy layer formed on the metal substrate, and a palladium or palladium alloy layer formed on the copper-nickel alloy layer.

6 Claims, 5 Drawing Sheets

SEMICONDUCTOR LEAD FRAME HAVING MULTI-LAYERED PLATING LAYER INCLUDING COPPER-NICKEL PLATING LAYER

BACKGROUND OF THE INVENTION

1. Field of the Invention

The present invention relates to a semiconductor lead frame, and more particularly, to a semiconductor lead frame having an improved multi-layered plating layer coated on the upper surface of a substrate, and a manufacturing method thereof.

2. Description of the Related Art

A general semiconductor lead frame is manufactured by a stamping process or an etching process. In a stamping process, a lead frame is manufactured by stamping an intermittently-transferred thin plate material with a press, which is suitable for mass production. The etching process, for forming a product by etching a part of a material using a chemical, is usually adopted to small scale production.

During a process for manufacturing a semiconductor package, a die pad and an inner lead are plated with a metal material to improve characteristics of wire bonding between a semiconductor chip and an inner lead and properties of the die pad. Also, a lead-tin plating layer can be coated on a predetermined portion of an outer lead in order to improve its soldering property. However, the above process is a wet plating process, conducted after the semiconductor packaging is completed, thus reducing the reliability of the product subject to such a process. Also, it is difficult to perform in an in-line process.

In order to overcome such problems, a pre-plated frame (PPF) method for forming a middle plating layer by coating a material, having good solder wettability, onto a substrate before the semiconductor packaging process occurs has been proposed. That is, referring to FIG. 1, a nickel plating layer 12 is formed on a metal substrate 11, and a palladium or palladium alloy layer 13 is coated on the nickel plating layer 12. The bottom surface of the substrate 11 is also coated with the same plating layers as above.

Here, the nickel plating layer 12 serves as a middle plating layer to decrease degradation of adhesiveness when the metal substrate 11 is plated with the palladium or palladium alloy layer 13. The palladium or palladium alloy layer 13 prevents surface oxidation of the nickel plating layer 12.

When these multiple plating layers are formed, the internal stress of the nickel plating layer 12 may be concentrated, and the nickel plating layer 12 may crack during a trimming or forming process when it has a significantly large thickness. Because of such crack generation, a copper element of the metal substrate 11 diffuses up to the surface of the palladium or palladium alloy layer 13, leading to galvanic corrosion. Therefore, the semiconductor lead frame has reduced anticorrosion properties. Also, since the palladium or palladium alloy layer 13 does not protect the nickel plating layer 12, the soldering wettability is reduced.

SUMMARY OF THE INVENTION

To solve the above problems, it is an object of the present invention to provide a semiconductor lead frame having excellent material properties by improving multiple plating layers formed on a substrate.

To accomplish the above object, there is provided a semiconductor lead frame comprising a metal substrate; a multi-layered plating layer plated on the substrate including a copper-nickel alloy layer formed on the metal substrate and a palladium or palladium alloy layer formed on the copper-nickel alloy layer. The copper-nickel alloy contains between 20 wt % and 80 wt % copper. A copper plating layer can be further formed between the metal substrate and the copper-nickel alloy layer. A palladium-nickel alloy layer can be further formed between the copper-nickel alloy layer and the palladium or palladium alloy layer.

According to another aspect of the present invention, there is provided a method of manufacturing a semiconductor lead frame having a multi-layered plating layer, comprising the steps of (a) preparing a metal substrate; (b) plating the metal substrate with a copper-nickel alloy layer, wherein the copper content of the copper nickel alloy is 20–80 wt %; and (c) plating the copper-nickel alloy layer with at least one additional plating layer. Here, the copper-nickel alloy layer is formed in a plating bath in which nickel salt, copper salt, a complexing agent and an additive are mixed. In the plating bath, the nickel salt is nickel chloride or nickel sulfamate ($Ni(NH_2SO_3)_2$ $4H_2O$) of 0.1 to 1.0 mol/l, the copper salt is copper sulfate ($CuSO_4$ $5H_2O$) or pyrophosphoric acid copper ($CU_2P_2O_7$ $3H_2O$) of 0.02 to 0.2 mol/l, the complexing agent is potassium diphosphate ($K_4P_2O_7$) of 0.3 to 1.0 mol/l, and the additive is sodium tetraborate ($Na_2B_4O_7$) of 0.1 to 0.5 mol/l. The temperature of the plate bath is between 44° C. and 55° C., the current density applied to the plate solution is 1 to 3.0 $A/dm^2$, and the pH is between 9.50 and 9.0.

BRIEF DESCRIPTION OF THE DRAWINGS

The above objective and advantage of the present invention will become more apparent by describing in detail a preferred embodiment of the present invention with reference to the attached drawings in which.

DESCRIPTION OF THE PREFERRED EMBODIMENTS

Figure 2:
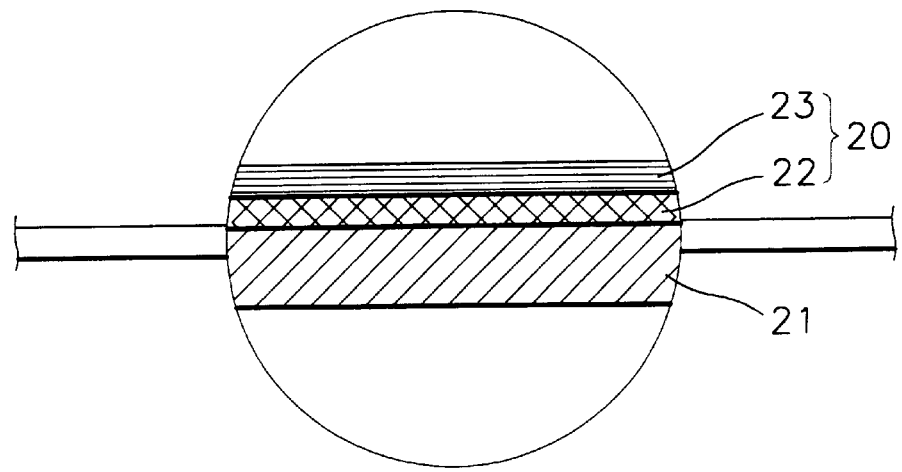
FIGS. 2 through 5 are cross-sectional views of a semiconductor lead frame according to the present invention.

Referring to FIG. 2, a semiconductor lead frame according to an embodiment of the present invention includes a metal substrate 21 and a multi-layered plating layer having a plurality of plating layers 20, plated on the metal substrate 21. More particularly, a copper-nickel alloy layer 22 and a palladium or palladium alloy layer 23 are sequentially formed on the metal substrate 21. Here, preferably, the metal substrate 21 is formed of copper or a nickel (42 wt %)-iron alloy (hereinafter, called "alloy 42").

To begin, in a process for plating the semiconductor lead frame, grease is removed from the surface of a metal substrate 21, made of copper or alloy 42, and the resultant surface is activated. Then, a copper-nickel alloy layer 22 is plated on the metal substrate 21, preferably to a thickness of between 0.01 and 5.0 micrometer ($\mu$m). Here, a plating bath contains a mixture of nickel salt, copper salt, a complexing agent and an additive. For example, the copper-nickel plating layer 22 can be formed in a plating bath in which nickel chloride ($NiCl_2$) of 0.1 to 1.0 mol/l is added to a solution containing copper sulfate ($CuSO_4 \cdot 5H_2O$) of 0.02 to 0.2 mol/l and potassium diphosphate ($K_4P_2O_7$) of 0.3 to 1.0 mol/l. Alternative materials and their equivalents may be used, for example, the copper sulfate ($CuSO_4 \cdot 5H_2O$) can be replaced by pyrophosphoric acid copper ($Cu_2P_2O_7 \cdot 3H_2O$), and the nickel chloride ($NiCl_2$) can be replaced by nickel sulfamate ($Ni(NH_2SO_3)_2 \cdot 4H_2O$). In order to alleviate a change in the pH, sodium tetraborate ($Na_2B_4O_7$) is added by 0.1 to 0.5 mol/l to the plating solution to act as a buffer.

The copper-nickel alloy layer 22 preferably contains between 20 wt % and 80 wt % copper. A desired composition and thickness of the copper-nickel alloy layer 22 can be obtained by changing conditions such as temperature, current density, and pH upon formation of the same. For example, when the temperature of the plating bath is between 44° C. and 55° C., the current density is 1 to 3.0 $A/dm^2$, and the pH is between 9.75 and 9.80, resulting in a copper-nickel alloy layer 22 containing 50 wt % or more of copper.

Finally, the palladium or palladium alloy layer is formed on the copper-nickel alloy layer 22 to a thickness of between 0.01 and 3.0 micrometer ($\mu$m). The palladium or palladium alloy layer 23 prevents oxidation of the copper-nickel alloy layer 22. Also, the palladium or palladium alloy layer 23 prevents surface diffusion of the copper-nickel alloy layer 22 upon soldering after packaging the semiconductor lead frame.

Figure 3:
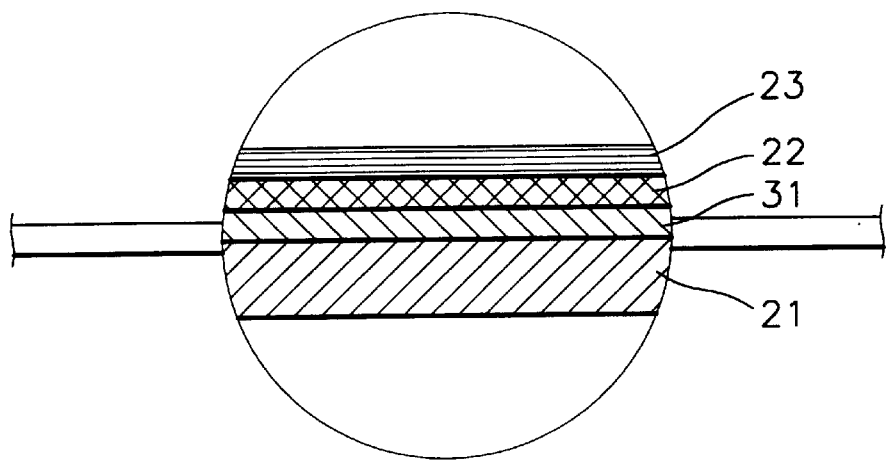
Figure 4:
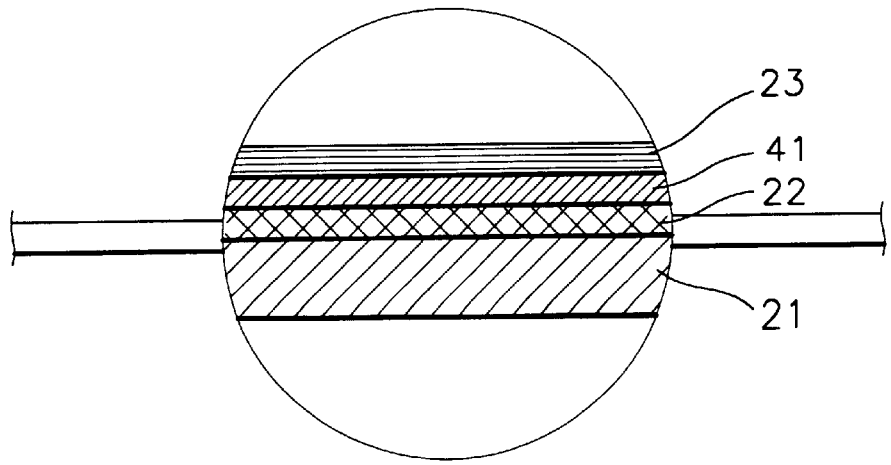
Figure 5:
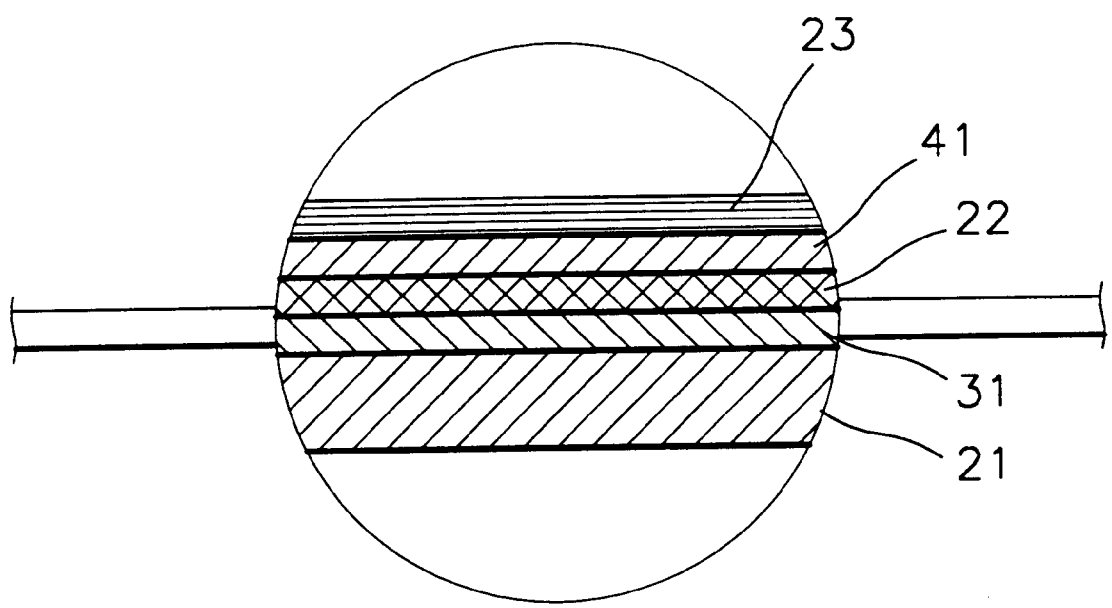

FIGS. 3 through 5 show the structure of a semiconductor lead frame according to other embodiments of the present invention. The same reference numerals as those in FIG. 2 denote the same or similar plating layers.

As shown in FIG. 3, a copper plating layer 31 is further formed between the metal substrate 21 and the copper-nickel alloy layer 22. The copper plating layer 31 can be formed by strike plating in a plating solution not containing cyanide ion ($CN^-$), for example, a pyrophosphoric acid copper ($Cu_2P_2O_7 \cdot 3H_2O$) plating solution. Such a plating process removes defective portions on the surface of the metal substrate 21, and prevents diffusion of the copper element of the metal substrate 21. Accordingly, the adhesiveness between the copper-nickel alloy layer 22 and the metal substrate 21 improves, and the plating layer becomes denser.

As shown in FIG. 4, a palladium-nickel alloy layer 41 can be interposed between the copper-nickel alloy layer 22 formed on the substrate 21 and the palladium alloy layer 23, where the palladium alloy layer 23 is the outermost layer.

Further, FIG. 5 shows a semiconductor lead frame in which a copper plating layer 31 is interposed between the metal substrate 21 and the copper-nickel alloy layer 22, and additionally, a palladium-nickel alloy layer 41 is formed between the copper-nickel alloy layer 22 and the palladium alloy layer 23, where the palladium alloy layer 23 is the outermost layer. The palladium-nickel alloy layer 41 prevents nickel in the copper-nickel alloy layer 22, formed on the bottom surface of the palladium-nickel alloy layer 41, from diffusing to the surface of the copper-nickel alloy layer 22.

Table 1 shows the results of a comparison of the anticorrosion of the copper-nickel alloy layer 22 formed on the metal substrate with those of nickel plating layer, a copper plating layer and an SUS plating layer as comparatives also formed thereon.

TABLE 1

| | | corrosive solution | | | | |
|---|---|---|---|---|---|---|
| | | HCl 10% | $H_2SO_4$ 10% | $HNO_3$ 10% | liquid ammonia 5% | NaOH 5% |
| mat-er-ial | copper-nickel alloy layer | ○ | ○ | Δ | ○ | ○ |
| | nickel plating layer | x | x | ○ | ○ | ○ |
| | copper plating layer | Δ | Δ | x | x | Δ |
| | SUS plating layer | x | ○ | ○ | ○ | ○ |

(○: good, Δ: average, x: bad)
(temperature 20° C.)

As can be seen from Table 1, the copper-nickel alloy layer has comparatively greater anticorrosion properties than those of the nickel plating layer, the copper plating layer, and the SUS plating layer, with respect to all corrosion solutions used in the present experiment. In particular, a corrosion minimum value with respect to the above corrosion solutions is at most 2 to 3 $mg/m^2 \cdot day$.

Figure 1:
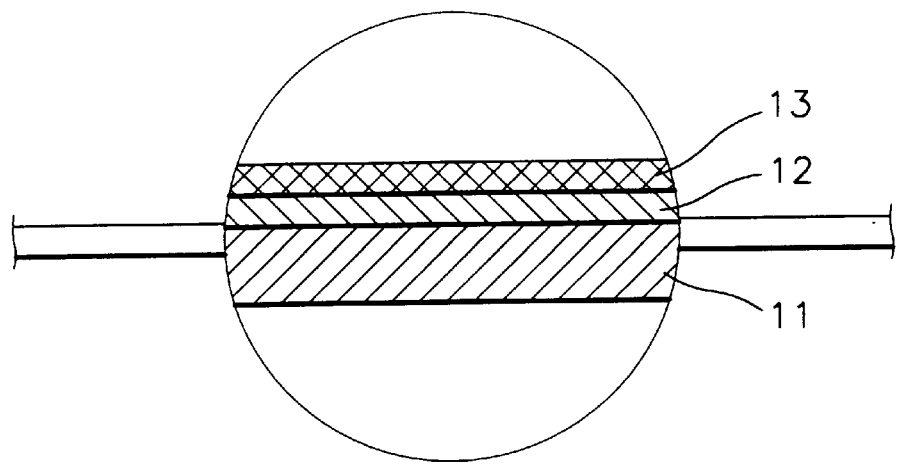
FIG. 1 is a cross-sectional view of a conventional semiconductor lead frame.
Figure 6:
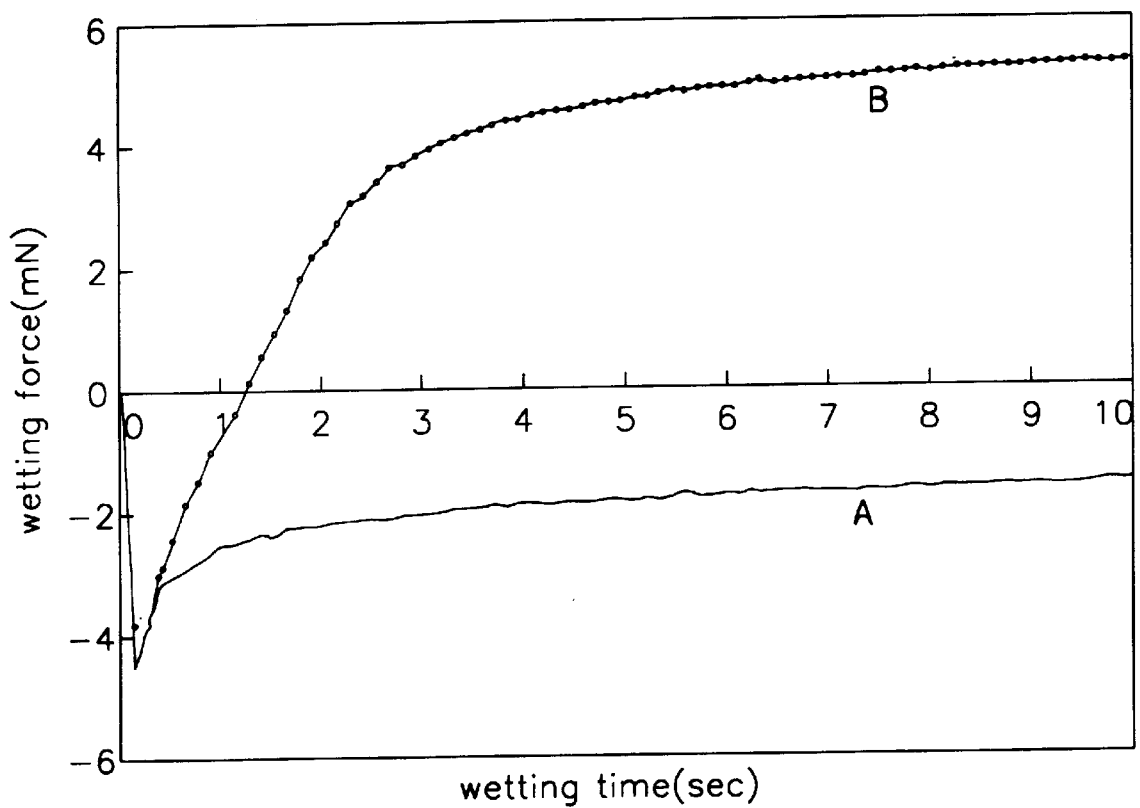
FIG. 6 is a graph showing soldering wettability of the conventional semiconductor lead frame and of the semiconductor lead frame according to the present invention.

FIG. 6 is a graph showing the soldering property of the conventional semiconductor lead frame in which the nickel plating layer 12 (see FIG. 1) and the palladium or palladium alloy layer 13 are stacked, and that of the semiconductor lead frame according to the present invention in which the copper-nickel alloy layer 22 (see FIG. 2) and the palladium or palladium alloy layer 23 are sequentially formed.

Here, the nickel plating layer 12 for the conventional semiconductor lead frame (Sample A) was formed to a thickness of about 1.0 micrometer by applying current at a current density of 6 $A/dm^2$ for 48 seconds in a plating bath. In the semiconductor lead frame according to the present invention (Sample B), the copper-nickel alloy layer 22 was formed to a thickness of 0.02 micrometer by applying current at a current density of 8 $A/dm^2$ for 30 seconds in a copper sulfate ($CuSO_4 \cdot 5H_2O$) or pyrophosphoric acid copper ($Cu_2P_2O_7 \cdot 3H_2O$) plating bath. Meanwhile, the palladium plating layer 13, 23 for each frame was formed to a thickness of approximately 4 micrometers, on the nickel plating layer 12 of Sample A, and on the copper-nickel alloy layer 22 of Sample B, respectively.

In the graph of FIG. 6, the X-axis indicates the time (in seconds) required for soldering, and the Y-axis indicates the solderability operating upon a plating layer during soldering. Curve A represents the amount of solder sticking to the surface of the conventional lead frame (Sample A) after the conventional lead frame is dipped in the solder of a fused state and the solder is removed from the conventional lead frame, according to time. Curve B represents the amount of solder sticking to the surface of the lead frame according to the present invention (Sample B) after the lead frame is dipped in the solder of a fused state and the solder is removed from the lead frame, according to time.

Referring to the curve A with respect to the conventional semiconductor lead frame, solderability is low due to the repelling force between the plating layer and the solder, even when about 10 seconds have passed, since the conventional lead frame was dipped in the solder. Whereas, in the curve B with respect to the semiconductor lead frame according to the present invention, solderability is lowered due to the repelling force in the early stage when the lead frame is dipped in the solder, but solderability is significantly enhanced after about one second has passed. Also, after about 3 to 4 seconds have passed, constant solderability is maintained.

Figure 7A:
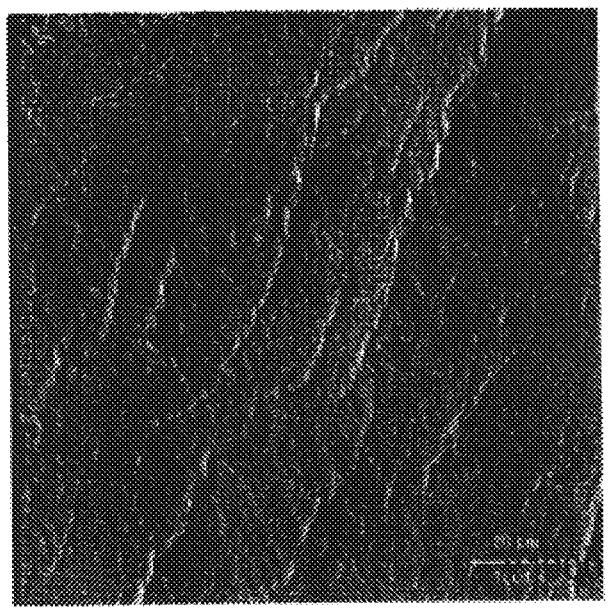
FIG. 7A is a magnified photograph of the surface of a conventional nickel plating layer.
Figure 7B:
FIG. 7B is a magnified photograph of the surface of a copper-nickel alloy layer according to the present invention.

FIGS. 7A and 7B are photographs of the surfaces of the conventional lead frame and the semiconductor lead frame according to the present invention, respectively, which are magnified by about 1000 times using a scanning electron microscope.

As seen in the photographs, the number of distributed cracks detected on the semiconductor lead frame according to the present invention is significantly reduced in comparison to the number of cracks detected on the conventional semiconductor lead frame. Also, the size of a crack, in a lead frame of the present invention, is significantly smaller than that of the cracks found in conventional lead frames.

According to the present invention, the semiconductor lead frame can have an improved properties including the mechanical process property, high temperature feature, and soldering property by forming the copper-nickel alloy 22 layer on the metal substrate 21. Thus, the concentration of internal stress in the plating layer during a trimming or forming operation in the semiconductor manufacturing process is minimized. The copper-nickel alloy layer 22 has excellent material properties even though it is significantly thinner than the conventional nickel plating layer, so that the manufacturing cost is effectively reduced. Also, use of the plating solution containing copper sulfate ($CuSO_4 \cdot 5H_2O$) or pyrophosphoric acid copper ($Cu_2P_2O_7 \cdot 3H_2O$) reduces environmental pollution.

The present invention was described referring to the embodiments shown in the drawings, but these are intended only as examples. It will be understood by those skilled in the art that various modifications and variations can be made without departing from the spirit or scope of the invention. Thus, it is intended that the present invention cover all modifications and variations that come within the scope of the appended claims and their equivalents.

What is claimed is:

1. A semiconductor lead frame comprising:
    a Cu-alloy substrate; and
    a multi-layered plating layer plated on the metal substrate, including a copper-nickel alloy plating layer, having between 20 wt % and 80 wt % of copper, formed on the Cu-alloy substrate, and a palladium or palladium alloy plating layer formed on the copper-nickel alloy plating layer.

2. The semiconductor lead frame as claimed in claim 1, wherein the plating layer further includes a copper plating layer between the Cu-alloy substrate and the copper-nickel alloy plating layer.

3. The semiconductor lead frame as claimed in claim 2, wherein the plating layer further includes a palladium-nickel alloy plating layer between the copper-nickel alloy plating layer and the palladium or palladium alloy plating layer.

4. The semiconductor lead frame of claim 1, wherein the plating layer further includes a palladium-nickel alloy plating layer between the copper-nickel alloy plating layer and the palladium or palladium alloy plating layer.

5. The semiconductor lead frame of claim 1, wherein the copper-nickel alloy plating layer is between 0.01 and 5.0 micrometers thick.

6. The semiconductor lead frame of claim 1, wherein the palladium or palladium alloy plating layer is between 0.01 and 3.0 micrometers thick.

* * * * *